United States Patent [19]
Yoshida et al.

[11] 3,787,962
[45] Jan. 29, 1974

[54] INSULATED GATE FIELD EFFECT TRANSISTORS AND METHOD OF PRODUCING THE SAME

[75] Inventors: Isao Yoshida, Kodaira; Takashi Tokuyama, Higashikurume; Shigeru Nishimatsu, Kokubunji; Takahide Ikeda, Kodaira, all of Japan

[73] Assignee: Hitachi, Ltd., Tokyo, Japan

[22] Filed: May 13, 1971

[21] Appl. No.: 142,933

[30] Foreign Application Priority Data

May 13, 1970 Japan ........................ 45/40114

[52] U.S. Cl. .............................. 29/571, 29/578
[51] Int. Cl. .............................. B01j 17/00
[58] Field of Search. 29/571, 578; 148/1.5; 317/235

[56] References Cited

UNITED STATES PATENTS 3,576,478 4/1971 Watkins ........................ 29/578
3,655,457 4/1972 Duffy ........................ 148/1.5
3,679,492 7/1972 Fang et al. ........................ 29/571

FOREIGN PATENTS OR APPLICATIONS 1,153,428 5/1969 Great Britain ........................ 317/235 E

*Primary Examiner*—Charles W. Lanham
*Assistant Examiner*—W. C. Tupman
*Attorney, Agent, or Firm*—Craig and Antonelli

[57] ABSTRACT

An insulated gate field effect transistor formed on one main surface of a semiconductor substrate comprising: a drain region of which the concentration of impurity is lower than twice that of the semiconductor substrate and the conductivity type is reverse to that of the substrate; and a region with a high concentration of impurity, formed in the low impurity concentration region, of which the conductivity type is the same as that of the low impurity concentration region.

10 Claims, 16 Drawing Figures

INVENTORS
ISAO YOSHIDA, TAKASHI TOKUYAMA
SHIGERU NISHIMATSU and TAKAHIDE IKEDA
BY
Craig, Antonelli & Hill
ATTORNEYS INVENTOR.
ISAO YOSHIDA, TAKASHI TOKUYAMA,
SHIGERU NISHIMATSU and TAKAHIDE IKEDA
BY Craig, Antonelli & Hill
ATTORNEYS INVENTORS
ISAO YOSHIDA, TAKAHASHI TOKUYAMA,
SHIGERU NISHIMATSU and TAKAHIDE IKEDA
BY
Craig, Antonelli & Hill
ATTORNEYS INVENTORS
ISAO YOSHIDA, TAKASHI TOKUYAMA,
BY SHIGERU NISHIMATSU and TAKAHIDE IKEDA
Craig, Antonelli & Hill
ATTORNEYS

INSULATED GATE FIELD EFFECT TRANSISTORS AND METHOD OF PRODUCING THE SAME

DETAILED DESCRIPTION OF THE INVENTION

This invention relates to insulated gate field effect transistors and methods of producing the same, and more particularly to insulated gate field effect transistors in which a low impurity concentration layer is disposed in the drain region whereby the feedback capacitance between the gate and drain is lowered and the transconductance is increased and thus improved high frequency characteristics are obtained.

To improve the high frequency characteristic of metal insulator semiconductor field effect transistor (hereinafter briefly referred to as MIS-FET) in the prior art, it has been known to be effective if the channel length of the gate region (channel region) located between the source and drain regions is made as short as possible and the capacitance between the gate and drain (or source) is reduced.

To realize this idea, a method of producing MIS-FET for high frequency applications was proposed in U.S. Pat. No. 3,472,712. According to this method, a gate electrode is disposed on one surface of a semiconductor substrate by way of an insulation layer, and source and drain regions are formed on the substrate by ion implantation using the gate electrode as a mask. In this MIS-FET, the channel length depends on the gate electrode width. In other words, the channel length can be reduced to the extent where photo-etching is applicable for the formation of the gate electrode. The source and drain regions can be formed without increasing the capacitance between the gate and drain (or source), contrary to the method of forming the source and drain regions by impurity diffusion, wherein the source and drain regions are extended to the region beneath the gate electrode and the gate electrode is superposed on the source or drain region to increase the capacitance therebetween. In the MIS-FET with a reduced channel length, however, it tends to give rise to a punch-through phenomenon between the source and drain due to expansion of the depletion layer in the channel region with an increase in the bias across the drain and source. Furthermore, the transconductance is varied widely by a change in the bias voltage.

To solve the problem of punch-through, some improved MIS-FETs in which a region of low impurity concentration is disposed in the drain region have been proposed heretofore. One of these MIS-FETs utilizes a double diffusion technique wherein an impurity for forming the gate region and an impurity for forming the source region are thermally diffused in succession into a semiconductor substrate (to become the drain region) of low impurity concentration whereby the source, gate and drain regions are formed along the vertical direction from the surface to the base of the substrate. Another MIS-FET is such that the gate region whose conductivity type is reverse or opposite to that of the substrate is formed on the surface of a semiconductor substrate of low impurity concentration by impurity diffusion process, and a layer of high impurity concentration whose conductivity type is the same as that of the substrate is disposed on the both sides of the gate region on the surface of the substrate whereby the drain and source regions are formed.

In the former MIS-FET, the channel length (the gate region width) can be reduced because the MIS-FET is formed by double diffusion. However, it is difficult to lead out the gate electrode; rarely, part of the surface of the substrate is etched as far as to the gate diffusion layer to expose the gate region, the hollow part formed by the etching is covered with a thin insulation film and the hollow is filled with a sufficiently thick gate electrode metal layer. In such structure, it is inevitable that the source region and gate electrode are superposed on each other and, as a result, the source gate capacitance is increased.

In the latter MIS-FET, a narrow gate region (short channel length) can hardly be realized because the gate region is formed by impurity diffusion. Furthermore, the electrical isolation between the source and drain is loose because the source and drain regions are linked with each other by way of the low impurity concentration substrate whose conductivity type is the same as those of the source and drain regions.

In view of the foregoing, a general object of this invention is to provide a MIS-FET in which the channel length is short and the drain region comprises a region whose impurity concentration is low, and to provide a method of producing such MIS-FET.

Briefly, in connection with a semiconductor device which comprises a semiconductor substrate, a source region, a drain region and a gate region wherein the source and drain regions whose conductivity types are reverse or opposite to that of the substrate are formed on the surface of the substrate by way of the gate region whose conductivity type is the same as that of the substrate, the MIS-FET of this invention is characterized in that the drain region comprises a region having a low impurity concentration, and a region having a high concentration of impurity with the same conductivity type as that of the substrate is disposed in the low impurity concentration region. The method of producing such MIS-FET according to this invention is characterized in that an insulated gate electrode is disposed on the surface of the semiconductor substrate, this electrode is used as a mask to implant thereinto ions of impurity whose conductivity type is reverse to that of the substrate, thereby forming a low impurity concentration region in the area corresponding to at least the drain region on the surface of the substrate and also forming a high impurity concentration region whose conductivity type is reverse to that of the substrate in the area corresponding to the low impurity concentration region and the source region.

According to this invention, the purpose of disposing a low impurity concentration region in the drain region is to keep the depletion layer from being extended into the gate region and to prevent the formation of a large gate drain feedback capacitance even if the gate electrode is superposed on the low impurity concentration region.

In the prior art, there exists difficulties in forming a low concentration diffusion layer on the surface of a semiconductor substrate. In contrast thereto, the invention provides a solution to this problem. Namely, a low concentration impurity diffusion layer is formed on the drain region by utilizing ion implantation techniques. In the method of forming an ion implantation region in a semiconductor substrate, the depth and concentration of the implantation region can be accurately controlled by suitably determining the ion energy, the ion current density, the implanting time, etc.

The concept of "low impurity concentration" used according to this invention denotes a low impurity concentration relative to the concentration of an impurity added thereto by the usual impurity thermal diffusion technique. To realize the purpose of this invention, it is desirable that the impurity concentration of the low impurity concentration region formed in the drain region be less than twice that of the substrate crystal. If the impurity concentration is more than twice that of the substrate, the extension of the depletion layer becomes prominent in the gate region rather than in the drain region. As a result, the punch-through pehnomenon occurs at a high rate while the MIS-FET is in operation. This makes it difficult to reduce the width of the gate region in the design stage, while, when the impurity concentration region of the low impurity concentration region is less than twice that of the substrate, the depletion layer is extended also into the low impurity concentration layer and, as a result, the extension of the depletion layer into the gate region is limited.

Furthermore, since usually the impurity concentration of the substrate of a MIS-FET is not too high (for example, $5.0 \times 10^{15}/cm^3$), the gate drain feedback capacitance is not appreciably large. This helps realize an operably ideal circuit design.

The invention will be better understood from the following detailed description taken in conjunction with the accompanying drawings.

BRIEF DESCRIPTION OF THE DRAWING

Referring now to FIGS. 1A and 1B, there are shown the essential structure of a MIS-FET embodying this invention; whereby FIG. 1A is a front view, and FIG. 1B is a longitudinal sectional view taken along line *Ib*—*Ib* of FIG. 1A.

In FIGS. 1A and 1B, the reference numeral 1 denotes a substrate such as, for example, an N type silicon substrate, and reference numerals 2 and 3 $P^-$ type low impurity concentration regions formed in the substrate within the area of the source and drain regions, respectively. According to this invention, the region 2 is not always required. Reference numerals 4 and 5 denote $P^+$ type high impurity concentration regions formed in the low impurity concentration regions 2 and 3. The $P^+$ type high impurity concentration region 4 formed in the source region is nearly fully superposed on the low impurity concentration layer 2, while, the $P^+$ type high impurity concentration region 5 formed in the drain region is formed within the $P^-$ type low impurity concentration region 3. Reference numeral 6 represents an insulation film, for example, an $SiO_2$ film, disposed on the surface of the substrate 1. This insulation film 6 is used as the gate insulation film located immediately beneath the gate electrode and also as the surface protection film of the MIS-FET. Reference numeral 7 denotes an insulation layer, for example, an $SiO_2$ film layer, disposed in the production process of the MIS-FET. This layer 7 is not very essential for the purposes of this invention. The aim of this layer 7 is to prevent an electrical short between the gate and drain electrodes. The reference numerals 8, 9 and 10 denote a source, drain and gate electrodes, respectively. Any material which can establish good ohmic contact with the silicon substrate may be used for these electrodes. Usually, such metals as aluminum, molybdenum, chromium, nickel and tungsten are used for the electrodes. Instead, a semiconductor layer of silicon or the like may be formed for use as the electrodes. In this embodiment, a molybdenum evaporation layer is used.

In FIG. 1A, reference numerals 8' and 10' indicate electrode bonding areas for external leads from the source and gate electrodes.

Figure 2:
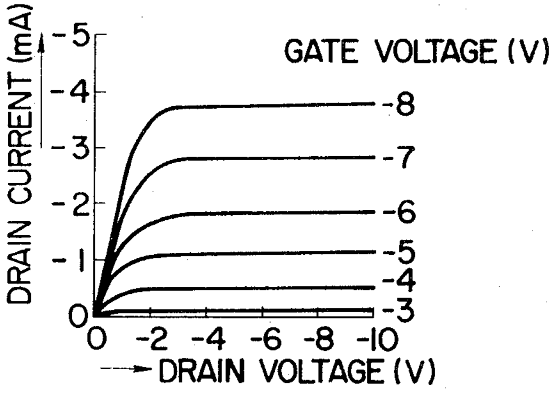
FIG. 2 is a diagram showing the electrical characteristics of a transistor of this invention.

A concrete example of this MIS-FET will be given below. Phosphorus is used as the impurity for the silicon substrate at an impurity concentration $N_D$ of about $5 \times 10^{15}/cm^3$. Boron is used as the impurity for the $P^-$ type low impurity concentration regions 2 and 3 at an impurity concentration $N_A$ of about $1 \times 10^{15}/cm^3$. Similarly, boron is used as the impurity for the $P^+$ type high impurity concentration regions 4 and 5 at an impurity concentration of about $5 \times 10^{19}/cm^3$. The regions 2 and 3 are formed to a thickness of about $3\mu$, the regions 4 and 5 to a thickness of about $1\mu$, the gate region to a width of $2\mu$, the $P^-$ type low impurity concentration region located between the gate region and the $P^+$ type high impurity concentration drain region 5 to a width of about $5\mu$, the $SiO_2$ films 6 and 7 to a thickness of about $0.2\mu$, and the molybdenum electrode layer to a thickness of about $0.5\mu$. This MIS-FET shows the electrical charactristics as indicated in FIG. 2.

Figure 3:
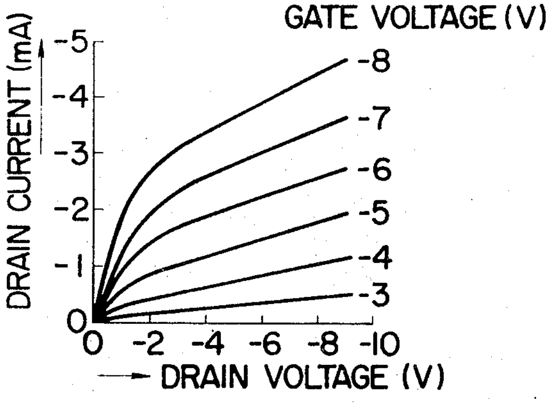
FIG. 3 is a diagram showing the electrical characteristics of a conventional insulated gate field effect transistor, and FIGS. 4A through 4H' illustrate by longitudinal sectional views the steps of the production of a MIS-FET according to this invention.

For comparison purpose, FIG. 3 shows the electrical characteristics of a conventional MIS-FET. From FIG. 3, it is apparent that the conventional MIS-FET is accompanied by a punch-through phenomenon, whereas, as indicated by the electrical characteristics in FIG. 2, the MIS-FET formed in the foregoing manner according to this invention gives rise to no punch-through phenomenon. The structure of the MIS-FET shown in FIG. 1 will be more apparent from the following description when read by referring to FIGS. 4A through 4H. Generally, several thousands of MIS-FETs are formed simultaneously in one semiconductor wafer. For explanatory simplicity, one MIS-FET element is considered in this embodiment, and FIG. 4 illustrates the essential parts thereof.

A $0.2\mu$ thick $SiO_2$ film 12 is formed by thermal oxidation on the surface of an N type silicon substrate 11 whose impurity concentration $N_D$ is $5 \times 10^{15}/cm^3$. An electrode metal such as Mo 13 is deposited on the $SiO_2$ film 12 to a thickness of $0.5\mu$. The Mo layer is selectively removed by an etching solution consisting chiefly of a mixture solution of $H_2SO_4$ and $HNO_3$ whereby grooves 14 and 15 are formed. This sample is placed in a conventional apparatus of ion implantation (not shown diagrammatically) and boron ions 16 are implanted into the sample at ion accelerating voltages of 400, 300, 200, 100 and 50kV to the value of $10^{11}$ parts/cm², respectively. (Note: Twenty seconds of ion irradiation is required for implanting $10^{11}$ parts /cm² ions.) The reason why the ions are implanted at different voltages (i.e., at different energies) is because the implanted impurity is distributed in the Gaussian form entering at a range R (distance from the surface of substrate) determined by this energy. In other words, to obtain a uniform impurity concentration distribution, it is necessary to implant ions thereinto in steps of energy. By adding the impurities together which have been implanted in steps, a uniform impurity distribution can be obtained. Thus, in the foregoing manner, 3μ thick $P^-$ type low impurity source and drain regions 17 and 18 with an impurity concentration of $1 \times 10^{15}/cm^3$ are formed.

In the ion implanting process, it is desirable that the substrate is kept heated at a temperature of 600 to 800°C during ion implantation or subjected to heat treatment at a temperature of 600° to 800°C after ion implantation. This consideration serves to improve the electrical characteristics of the PN junction formed in the substrate. Then, the Mo layer excepting specific areas is removed by etching, and an about 0.2μ thick $SiO_2$ film 19 is deposited on the surface of the substrate by thermal decomposition of organo-oxy-silane or mono-silane. In order to expose part or the whole of the $SiO_2$ layer 12 which covers the low impurity source and drain regions, grooves 20 and 21 are formed on the $SiO_2$ layer 12 by photo-etching technique.

Figure 4A:
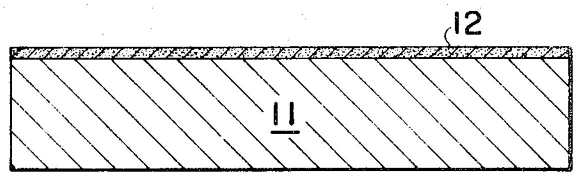
Figure 4B:
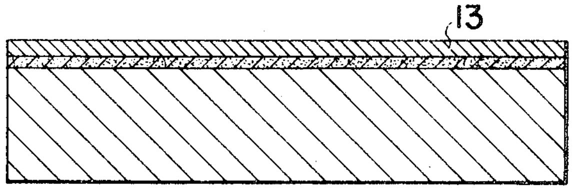
Figure 4C:
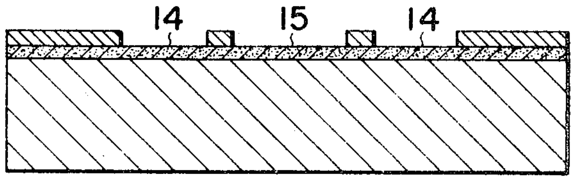
Figure 4D:
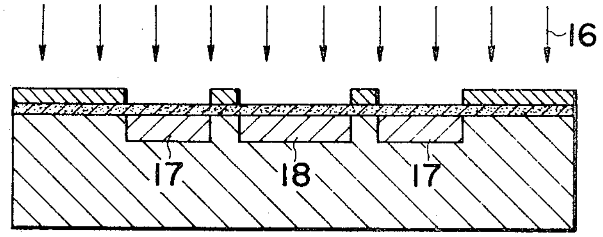
Figure 4E:
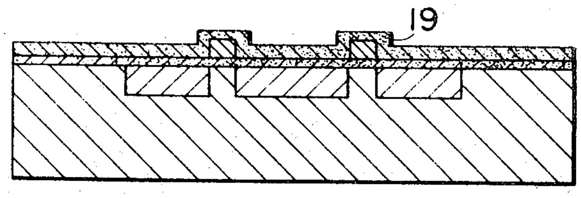
Figure 4F:
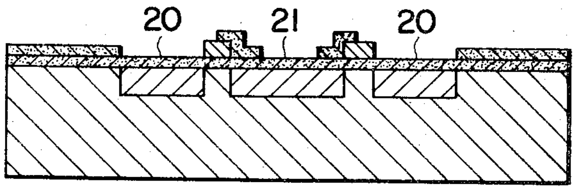
Figure 4G:
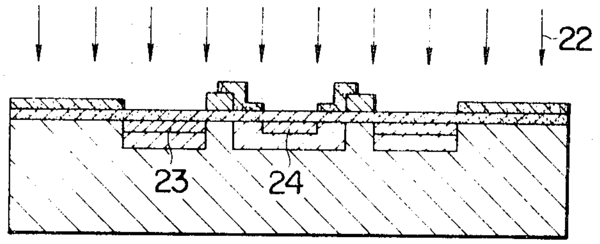

Then, the sample is placed in the ion implantation apparatus again, and boron ions 22 are irradiated onto the sample. In this process, the ions are accelerated at 100kV and irradiated for 2 minutes (implanted quantity: $10^{15}$ parts/cm$^2$) and then at 50kV for 2 minutes (implanted quantity: $10^{15}$parts/cm$^2$). The ions do not pass through the region of the double $SiO_2$ film and the metal layer but through the thin $SiO_2$ layer whereby $P^+$ high impurity concentration source and drain regions 23 and 24 with an impurity concentration $N_A$ of $5 \times 10^{19}/cm^3$ are formed to a depth of 1μ.(FIG. 4G)

Figure 4H:
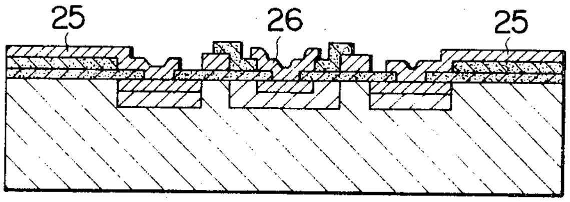
Figure 4E:
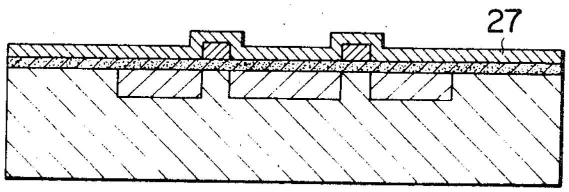
Figure 4F:
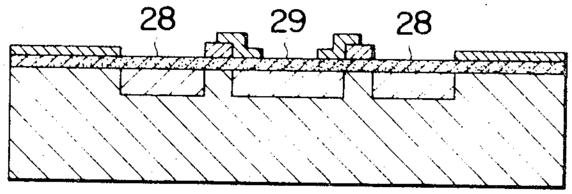
Figure 4G:
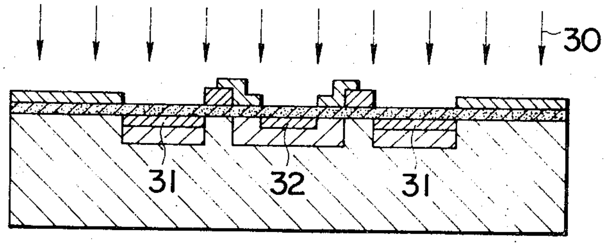
Figure 4H:
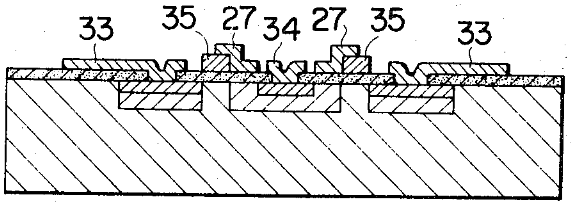

Part of the $SiO_2$ film 12 on the high impurity concentration regions 23 and 24 is removed to expose the electrode areas of the regions 23 and 24, and source and gate electrodes 25 and 26 are formed by evaporation of molybdenum. (FIG. 4H)

Figure 1A:
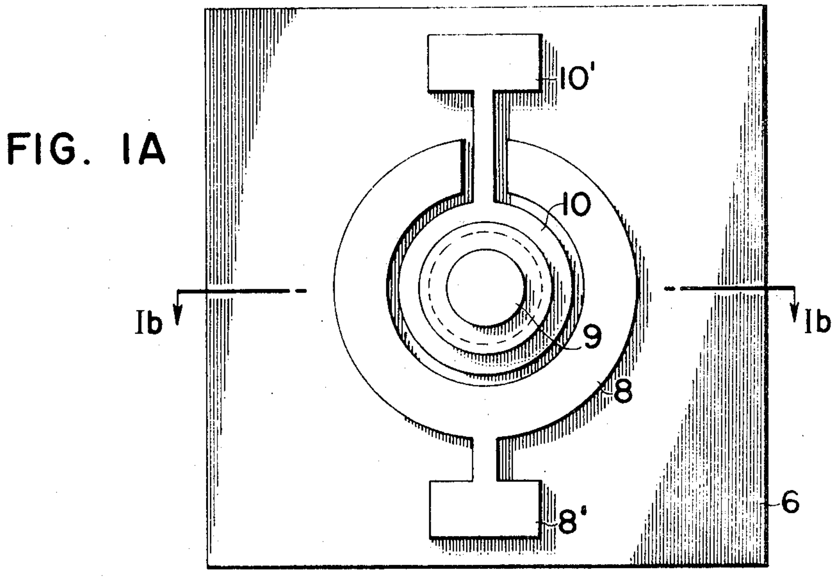
FIG. 1A is a front view and FIG. 1B a longitudinal sectional view illustrating a MIS-FET embodying this invention.
Figure 1B:
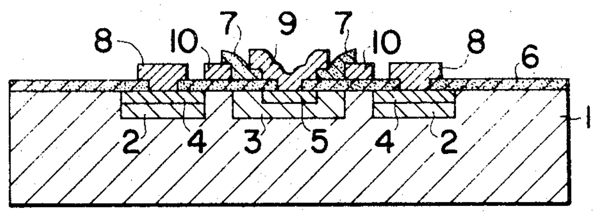

Thus, a MIS-FET as shown in FIG. 1 is formed.

The production steps (E), (F), (G) and (H) may be replaced with steps (E'), (F'), (G') and (H'). Ions are implanted into the surface of the substrate as shown in FIG. 4D, and then a metal layer 27 of aluminum, molybdenum, chromium, tantalum or the like is deposited on the surface of the substrate as shown in FIG. 4E'. Specific areas 28 and 29 are removed by photo-etching in order to expose part or the whole of the $SiO_2$ film 12 located above the low impurity concentration region. (FIG. 4F').

Then, boron ions 30 are irradiated onto the sample in the same manner as in FIG. 4G whereby boron high impurity concentration regions 31 and 32 (i.e., source and drain regions) are formed.

After this process, part of the $SiO_2$ film on the high impurity concentration region is exposed, and source and drain electrode metals are deposited on the exposed area. The MIS-FET formed in the above manner is shown by a longitudinal sectional diagram in FIG. 4H' wherein reference numerals 33, 34 and 35 denote the source, drain and gate electrodes, respectively. The difference between the MIS-FET shown in FIG. 4H and that in FIG. 4H' is that the metal layer which serves as the gate electrode is extended into the region above the low impurity concentration drain region in the structure shown in FIG. 4H'.

The low impurity concentration drain region according to this invention is formed by ion implantation. In order to control the impurity concentration of this drain region to be less than twice that of the substrate, it is necessary that a reverse conductivity type impurity whose impurity concentration is in the range from 1 to 2 times the impurity concentration of the substrate is added to the substrate crystal.

To know the quantity of ions implanted into the surface of the semiconductor substrate, the current (micro-coulomb/cm$^2$) flowing in the substrate during ion implantation is measured. The number of implanted ions is given in terms of current.

The foregoing MIS-FET formed according to this invention has the following advantages:

1. Because of a low impurity concentration region disposed in the drain region, extension of the depletion layer into the gate region is limited and, as a result, the channel length is reduced and thus a MIS-FET with desirable high frequency characteristics can be obtained.

2. It has been impossible by the diffusion technique to form a low impurity concentration region of reverse conductivity type whose impurity concentration is less than twice that of the substrate, whereas, according to this invention, the impurity concentration can easily be controlled by the use of ion implantation.

3. The source, drain and gate electrodes can be gathered on the surface of one semiconductor substrate. In the production of integrated circuit, all wiring can be disposed on the surface of one chip be metal evaporation. Thus, the production efficiency can be markedly increased.

4. The MIS-FET of this invention can be formed within a reduced time and at a low temperature. Practically, the time required for ion implantation is only several tens of minutes, and the heat applied to the semiconductor substrate is only 600° to 800°C during ion implantation or only 600° to 700°C after ion implantation, whereas the temperature and time required for impurity thermal diffusion are 1,200°C and several hours, respectively. In other words, the invention is suitably applicable to mass production of MIS-FET and integrated circuit devices and is highly useful for various industrial purposes.

It is apparent that the invention is not limited to the foregoing examples but numerous modifications thereof may be made without departing from the true spirit of the invention.

For example, the known semiconductor such as Ge, GaAs, InP and InSb may be used instead of Si for the semiconductor substrate. In the foregoing embodiments, an $SiO_2$ film is used for the insulation film on the semiconductor substrate. Instead, an $Si_3N_4$ film, $Al_2O_3$ film, $SiO_2 \cdot P_2O_5$ (phosphosilicate glass) film, $SiO_2 \cdot PbO$ (leadsilicate glass) film, $SiO_2 \cdot B_2O_5$ (boronsilicate glass) film, a double film formed by combining two films such as $SiO_2$ and $SiO_2 \cdot P_2O_5$ films, $SiO_2$ and $Al_2O_3$ films, etc., may be used.

Also, a semiconductor material such as silicon may be used instead of metal for the gate electrode. When silicon is used for the gate electrode, the threshold voltage of the insulated gate field effect transistor can be controlled by suitably adding an impurity to the silicon layer.

While we have shown and described several embodiments in accordance with the present invention, it is understood that the same is not limited thereto but is susceptible of numerous changes and modifications as known to those skilled in the art and I therefore do not want to be limited to the details shown and described herein, but intend to cover all such changes and modifications as are within the scope of the appended claims.

What we claim is:

1. A method of producing an insulated gate field effect transistor, comprising the steps of:

a. providing an insulation film on the surface of a semiconductor substrate of a first conductivity type;
b. providing a layer of material capable of forming a gate electrode on said insulation film;
c. forming first and second apertures of prescribed shapes separated from each other by a specified distance in said layer of material, and thereby forming a gate electrode, between said first and second apertures, on said insulation film;
d. irradiating a first beam of ions of an impurity of a second conductivity type opposite said first conductivity type onto the surface of said substrate, said gate electrode masking the surface portion of said substrate therebeneath against said first beam of ions and thereby providing low impurity concentration regions of said second conductivity type respectively corresponding to source and drain regions in first and second surface portions of said substrate disposed directly beneath said first and second apertures in said layer of material, with the extent of the portion of said substrate between said first and second surface portions thereof being defined by said gate electrode disposed thereabove on said insulation film;
e. forming an ion implantation preventing mask film on the surface portion of said insulation film adjacent said gate electrode which has been exposed by said second aperture; and
f. irradiating a second beam of ions of said impurity of said second conductivity type onto the surface of said substrate, and thereby forming high impurity concentration regions of said second conductivity type in said source and drain regions.

2. A method of producing an insulated gate field effect transistor in accordance with claim 1, wherein the semiconductor substrate is kept heated at a temperature of 600° to 800°C during the step for forming the low impurity concentration region and high impurity concentration region by ion implantation.

3. A method of producing an insulated gate field effect transistor in accordance with claim 1, characterized in that the semiconductor substrate is heated at a temperature of 600° to 800°C after the step for forming the low impurity concentration region by ion implantation.

4. A method of producing an insulated gate field effect transistor in accordance with claim 1, wherein the semiconductor substrate is heated at a temperature of 600° to 800°C after the step for forming the high impurity concentration region by ion implantation.

5. A method of producing an insulated gate field effect transistor in accordance with claim 1, wherein the energy of ion implantation is determined so that the impurity concentration of said low impurity concentration region is kept smaller than that of said substrate during ion implantation in the step for forming the low impurity concentration region by ion implantation.

6. A method of producing an insulated gate field effect transistor in accordance with claim 1, wherein said material layer which can form the gate electrode and is disposed on said insulation film, is formed of a metal layer.

7. A method of producing an insulated gate field effect transistor in accordance with claim 1, wherein said material layer which can form the gate electrode and is disposed on said insulation film, is formed of a semiconductor layer.

8. A method of producing an insulated gate field effect transistor comprising the steps of:

a. providing an insulation film on the surface of a semiconductor substrate of a first conductivity type;
b. providing a gate electrode on said insulation film;
c. irradiating a first beam of ions of an impurity material of a second conductivity type opposite said first conductivity type onto said substrate, said gate electrode masking a first surface portion of the substrate therebeneath against said first beam of ions, and thereby forming a drain region in a second surface portion of said substrate, said second surface portion being adjacent said first surface portion of said substrate;
d. forming an ion implantation preventing mask film on the surfaces of said insulation film and said gate electrode;
e. forming a first aperture in said ion implantation preventing mask film and thereby exposing a first surface portion of said insulation film above a third surface portion of said substrate which is separated from said drain region by said first surface portion of said substrate;
f. forming a second aperture in said ion implantation preventing mask film and thereby exposing a second surface portion of said insulation film above a first portion of said drain region, with one edge of said second aperture being positioned above one end of said first portion of said drain region which is separated from the boundary of said drain region and said first surface portion of the substrate; and
g. irradiating a second beam of ions of an impurity having said second conductivity type onto the surface of said substrate, and thereby forming a first high impurity concentration region in said third surface portion of said substrate directly beneath said first aperture and a second high impurity concentration region in said first portion of said drain region directly beneath said second aperture.

9. A method of producing an insulated gate field effect transistor in accordance with claim 1, wherein said step (e) comprises forming said ion implantation preventing mask film so as to extend on said insulation film from one edge of said gate electrode to a first surface portion of said insulation film above said drain region, while leaving a second surface portion of said insulation film above said drain region exposed.

10. A method of producing an insulated gate field effect transistor comprising the steps of:

a. providing an insulation film on the surface of a semiconductor substrate of a first conductivity type;
b. providing a gate electrode on said insulation film,
c. irradiating a first beam of ions of an impurity material of a second conductivity type opposite said first conductivity type onto said substrate, said gate